(12) United States Patent
Wada et al.

(10) Patent No.: US 7,956,397 B2
(45) Date of Patent: Jun. 7, 2011

(54) SEMICONDUCTOR DEVICE, CHARGE PUMPING CIRCUIT, AND SEMICONDUCTOR MEMORY CIRCUIT

(75) Inventors: Osamu Wada, Yokohama (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 11/863,849

(22) Filed: Sep. 28, 2007

(65) Prior Publication Data

US 2008/0237673 A1    Oct. 2, 2008

(30) Foreign Application Priority Data

Sep. 29, 2006    (JP) .................................. 2006-268276

(51) Int. Cl.
*G11C 11/34* (2006.01)
*H01L 29/94* (2006.01)
*G05F 1/10* (2006.01)

(52) U.S. Cl. .. 257/299; 327/536; 365/184; 257/E29.345
(58) Field of Classification Search .................. 327/536; 365/184; 257/299
See application file for complete search history.

(56) References Cited

U.S. PATENT DOCUMENTS

| 5,828,095 | A | 10/1998 | Merritt |
| 5,998,826 | A * | 12/1999 | Hung et al. .................... 257/315 |
| 6,549,458 | B1 * | 4/2003 | Rao et al. ................. 365/185.08 |
| 2003/0022445 | A1 * | 1/2003 | Taniguchi et al. ............ 438/257 |

FOREIGN PATENT DOCUMENTS

| JP | 2000-216253 | 8/2000 |
| JP | 2003-115537 | 4/2003 |
| JP | 2003-243521 | 8/2003 |
| JP | 2003-297936 | 10/2003 |

* cited by examiner

*Primary Examiner* — Jarrett J Stark
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A semiconductor device comprising:
  a first well region which is formed at a surface portion of a semiconductor substrate and to which a first voltage is applied;
  a gate insulating film which is formed on the first well region;
  a gate electrode which is formed on the gate insulating film and has a polarity different from a polarity of the first well region and to which a second voltage is applied; and
  an element isolating region which is formed at a surface portion of the first well region to surround a region within the first well region that is opposed to the gate insulating film,
wherein a capacitance is formed between the region within the first well region surrounded by the element isolating region and the gate electrode.

8 Claims, 8 Drawing Sheets

Vg : GATE VOLTAGE

SEMICONDUCTOR DEVICE, CHARGE PUMPING CIRCUIT, AND SEMICONDUCTOR MEMORY CIRCUIT

CROSS REFERENCE TO RELATED APPLICATIONS

This application is based upon and claims benefit of priority from the prior Japanese Patent Application No. 2006-268276, filed on Sep. 29, 2006, the entire contents of which are incorporated herein by reference.

BACKGROUND OF THE INVENTION

1. Field of the Invention

The present invention relates to a semiconductor device, a charge pumping circuit, and a semiconductor memory circuit.

2. Related Art

A MOS-type capacitor is often adopted as a capacitor element used in a circuit which is fabricated by a CMOS (Complementary Metal Oxide Semiconductor) process, in consideration of matching of the capacitor element to other MOS transistors. A MOS-type capacitor can also be used as an anti-fuse element which performs a write operation by breaking down a gate insulating film and short-circuiting a gate and a substrate.

There are two typical structures for MOS-type capacitors. One is a MOS transistor structure composed of a P well region, two $N^+$ diffusion layers which are formed in the P well region and serve as source and drain electrodes, a $P^+$ diffusion layer which serves as an electrode for the P well region, a gate insulating film which is provided between the $N^+$ diffusion layers on the P well region, and a gate electrode which is provided on the gate insulating film and is made of polysilicon doped with impurities exhibiting N-type conductivity.

When a positive voltage is applied to a gate electrode of such a MOS transistor, and a negative voltage is applied to $N^+$ diffusion layers and a $P^+$ diffusion layer, if the gate voltage is not less than the threshold voltage of the transistor, a channel region is formed between the $N^+$ diffusion layers, and a portion between the gate electrode and the channel region (the gate insulating film) acts as a capacitance. This causes the MOS transistor to function as a MOS-type capacitor.

However, if the gate voltage is less than the threshold voltage, a depletion layer is formed at the surface of the P well region in this MOS-type capacitor. In this case, a depletion layer capacitance generated in the depletion layer and a capacitance in a gate insulating film may be series-connected, and the total capacity of the MOS-type capacitor may decrease.

The other typical structure for MOS-type capacitors is composed of an N well region, two $N^+$ diffusion layers which serve as electrodes for the N well region, a gate insulating film which is provided between the $N^+$ diffusion layers on the N well region, and a gate electrode which is provided on the gate insulating film and is made of polysilicon doped with impurities exhibiting N-type conductivity.

When a positive voltage is applied to a gate electrode of such a MOS-type capacitor, and a negative voltage is applied to $N^+$ diffusion layers, the MOS-type capacitor enters an accumulation state in which negative charges are accumulated between the $N^+$ diffusion layers at the surface of an N well region on the side of a gate insulating film. Even if the voltage is low, the MOS-type capacitor can achieve a relatively large capacity.

However, since the gate electrode of the MOS-type capacitor is doped with impurities exhibiting N-type conductivity, electrons floating in the gate electrode are attracted to the positive charge side (the side opposite to the gate insulating film), and a depletion layer is generated at the surface on the gate insulating film side of the gate electrode. For this reason, a depletion layer capacitance generated in the depletion layer and a capacitance in the gate insulating film may be series-connected, and the total capacity of the MOS-type capacitor may decrease.

An anti-fuse element using a MOS-type capacitor causes an electrical breakdown by applying a high voltage to a gate insulating film. Generation of a depletion layer brings the anti-fuse element to the same state as that when the thickness of the gate insulating film becomes larger, and an applied voltage required for an electrical breakdown increases. Also, the area of a circuit for generating the voltage increases.

A MOS-type capacitor is often used in, e.g., a charge pumping circuit which forms a boosted voltage power supply. A charge pumping circuit is a circuit which boosts the voltage from a low voltage power supply by charge and discharge of a capacitor and supplies a high voltage to an internal circuit. Since a MOS-type capacitor as described above decreases in capacity due to generation of a depletion layer, the voltage boosting capability when it is used in a charge pump is limited.

SUMMARY OF THE INVENTION

According to one aspect of the present invention, there is provided a semiconductor device comprising:

a first well region which is formed at a surface portion of a semiconductor substrate and to which a first voltage is applied;

a gate insulating film which is formed on the first well region;

a gate electrode which is formed on the gate insulating film and has a polarity different from a polarity of the first well region and to which a second voltage is applied; and an element isolating region which is formed at a surface portion of the first well region to surround a region within the first well region that is opposed to the gate insulating film, wherein a capacitance is formed between the region within the first well region surrounded by the element isolating region and the gate electrode.

According to one aspect of the present invention, there is provided a charge pumping circuit comprising:

an input MOS transistor having a source region connected to an input terminal to which a power supply voltage is applied;

m (m is an integer not less than 2) boost MOS transistors series-connected between a drain of the input MOS transistor and an output terminal from which a boosted voltage is output; and m MOS capacitors, each MOS capacitor having a first well region which is formed at a surface portion of a semiconductor substrate, a gate insulating film which is formed on the first well region, a gate electrode which is formed on the gate insulating film and has a polarity different from a polarity of the first well region, and an element isolating region which is formed at a surface portion of the first well region to surround a region within the first well region that is opposed to the gate insulating film, a capacitance being formed between the region within the first well region surrounded by the element isolating region and the gate electrode, wherein one of the gate electrode and the first well region of each of the m MOS capacitors is connected to a source region of a corresponding one of the m boost MOS transistors, the other of the gate electrode and the first well region of an s-th (s is an odd number satisfying 1≦s≦m) one of the MOS capacitors is supplied with a first pulse signal, and the other of the gate electrode and the first well region of a t-th (t is an even number satisfying 2≦t≦m) one of the MOS capacitors is supplied with a second pulse signal which is obtained by inverting the first pulse signal.

According to one aspect of the present invention, there is provided a semiconductor memory circuit comprising:

a plurality of fuse word lines which are arranged row-wise;

a plurality of data lines which are arranged column-wise;

memory sections which are respectively arranged at intersections of the fuse word lines and the data lines and can store data;

registers which are respectively connected to the data lines and in which the data transferred from the memory sections are stored; and a voltage controlling section which is connected to the memory sections and outputs a voltage to the memory sections, wherein each memory section has a memory element which includes a first well region formed at a surface portion of a semiconductor substrate, a gate insulating film formed on the first well region, a gate electrode formed on the gate insulating film and having a polarity different from a polarity of the first well region, and an element isolating region formed at a surface portion of the first well region to surround a region within the first well region that is opposed to the gate insulating film and is enabled to store data by a breakdown of the gate insulating film, a first transistor in which one of a source and a drain is connected to the data line, the other is connected to one of the first well region and the gate electrode of the memory element, and a gate is connected to the fuse word line, and a second transistor in which one of a source and a drain is connected to one of the first well region and the gate electrode of the memory element, the other is connected to the other of the first well region and the gate electrode of the memory element and is supplied with the voltage output from the voltage controlling section, and a gate is connected to the fuse word line.

DETAILED DESCRIPTION OF THE INVENTION

Embodiments of the present invention will be described below with reference to the drawings.

First Embodiment

Figure 1:
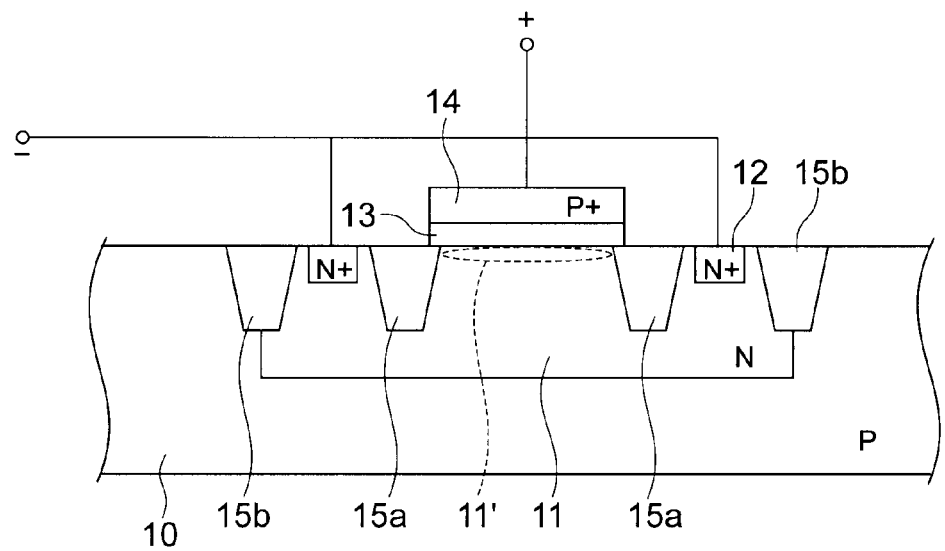
FIG. 1 is a view showing the schematic configuration of a semiconductor device according to a first embodiment of the present invention.

FIG. 1 schematically shows a vertical section of a semiconductor device according to a first embodiment of the present invention. An N well region 11 is provided at the surface of a P-type semiconductor substrate 10, and element isolating regions 15 (15a and 15b) and an N$^+$ diffusion layer 12 which serves as an electrode for applying a voltage to the N well region 11 are formed in the N well region 11. The N$^+$ diffusion layer 12 is formed between the element isolating regions 15a and 15b.

A gate insulating film 13 is provided on the N well region 11, and a gate electrode 14 is provided on the gate insulating film 13. The gate electrode 14 is made of polysilicon doped with highly concentrated impurities of a polarity (in this case, P-type) opposite to that of the well region. The element isolating regions 15 are formed by STI (Shallow Trench Isolation).

Figure 2:
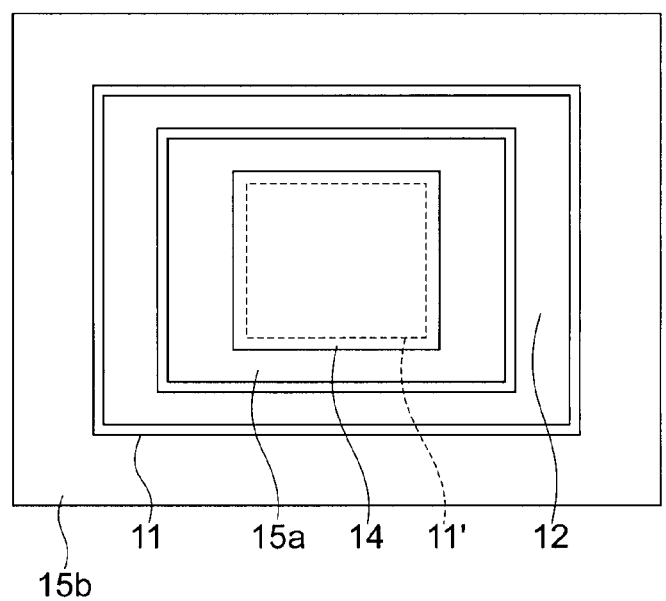
FIG. 2 is a view showing the schematic configuration of the semiconductor device according to the first embodiment.

FIG. 2 shows a view of the semiconductor device as seen from above. The element isolating region 15a is formed in the N well region 11 along the edges of the gate electrode 14. The element isolating region 15a prevents part of P-type impurities which has deviated from the gate electrode 14 from diffusing into the N$^+$ diffusion layer 12 when the gate electrode 14 is doped with the P-type impurities.

Figure 3:
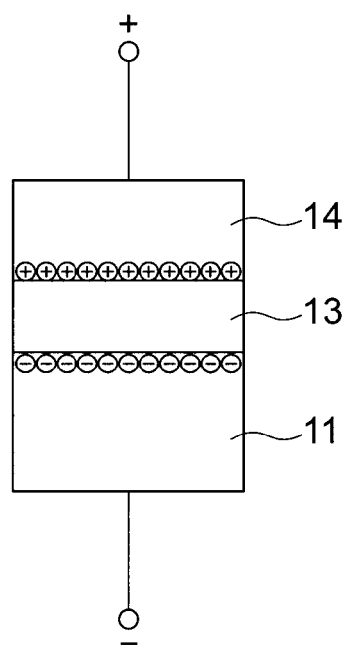
FIG. 3 is an enlarged schematic view of a portion near a gate insulating film of the semiconductor device according to the first embodiment.

A positive voltage is applied to the gate electrode 14 while a negative voltage is applied to the N$^+$ diffusion layer 12. FIG. 3 shows a schematic view representing the state of a portion near the gate insulating film 13 at this time. Negative charges (electrons) are accumulated at a surface portion 11' on the gate insulating film 13 side of the N well region 11. Positive charges (holes) are accumulated at a surface portion on the gate insulating film 13 side of the gate electrode 14.

The N well region 11 inherently has many electrons while the gate electrode 14 inherently has many holes. Accordingly, no depletion layer is formed upon application of a voltage in either the surface portion on the gate insulating film 13 side of the N well region 11 or that on the gate insulating film 13 side of the gate electrode 14, and the capacity of the semiconductor device becomes correspondent to only the thickness of the gate insulating film.

FIRST COMPARATIVE EXAMPLE

Figure 4:
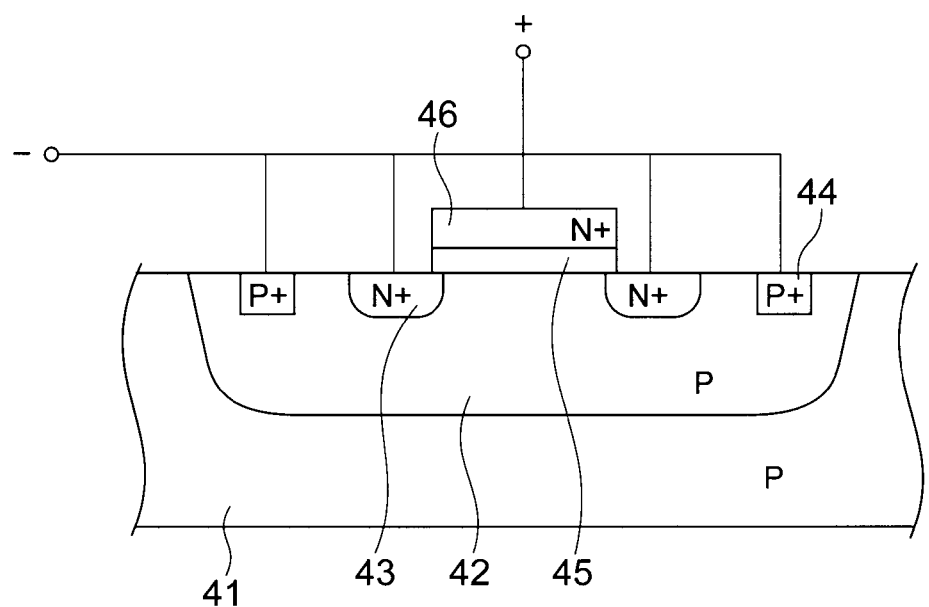
FIG. 4 is a view showing the schematic configuration of a semiconductor device according to a comparative example.

FIG. 4 shows the schematic configuration of a semiconductor device according to a comparative example (first comparative example) for the first embodiment. A P well region 42 is provided at the surface of a P-type semiconductor substrate 41. A P+ diffusion layer 44 which serves as an electrode for applying a voltage and N+ diffusion layers 43 which constitute a source and drain are formed in the P well region 42.

A gate insulating film 45 is provided on the P well region 42, and a gate electrode 46 is provided on the gate insulating film 45. The gate insulating film 45 is made of a silicon oxide film. The gate electrode 46 is made of polysilicon doped with highly concentrated impurities of a polarity (in this case, N-type) opposite to that of the well region.

When a positive voltage is applied to the gate electrode 46, and a negative voltage is applied to the N+ diffusion layers 43 and P+ diffusion layer 44, if the gate voltage is not less than a threshold voltage, a channel region is formed between the N+ diffusion layers 43, a portion between the gate electrode and the channel region across the gate insulating film 45 from each other acts as a capacitance, and the semiconductor device functions as a MOS-type capacitor.

Figure 5:
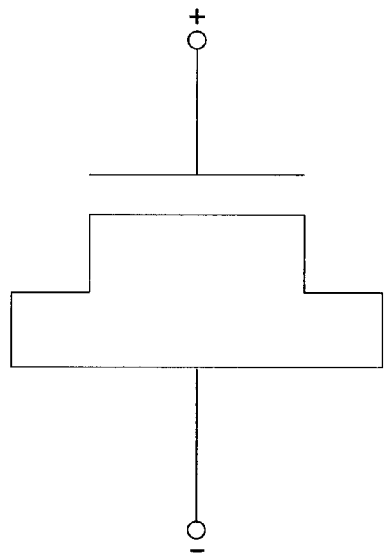
FIG. 5 is a diagram showing an equivalent circuit of the semiconductor device according to the comparative example.
Figure 6:
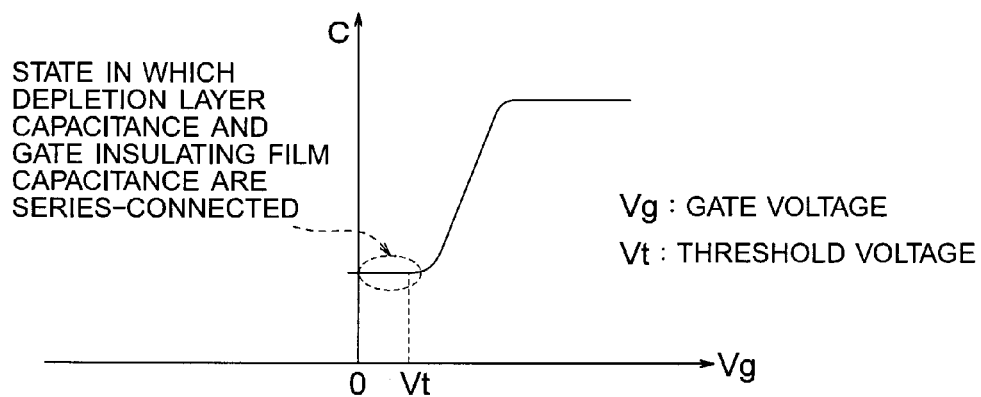
FIG. 6 is a graph showing the C-V characteristic of the semiconductor device according to the comparative example.

FIG. 5 shows a diagram of an equivalent circuit of the MOS-type capacitor. FIG. 6 shows the C-V characteristic of the MOS-type capacitor. In the MOS-type capacitor with the above-described configuration, if the gate voltage is less than the threshold voltage, a depletion layer is formed between the N+ diffusion layers, a depletion layer capacitance generated in the depletion layer and a capacitance in the gate insulating film are series-connected, and the total capacity of the semiconductor device decreases.

As described above, since the capacity of the MOS-type capacitor as the semiconductor device according to the comparative example changes depending on an applied voltage, it is difficult to achieve a constant capacity.

SECOND COMPARATIVE EXAMPLE

Figure 7:
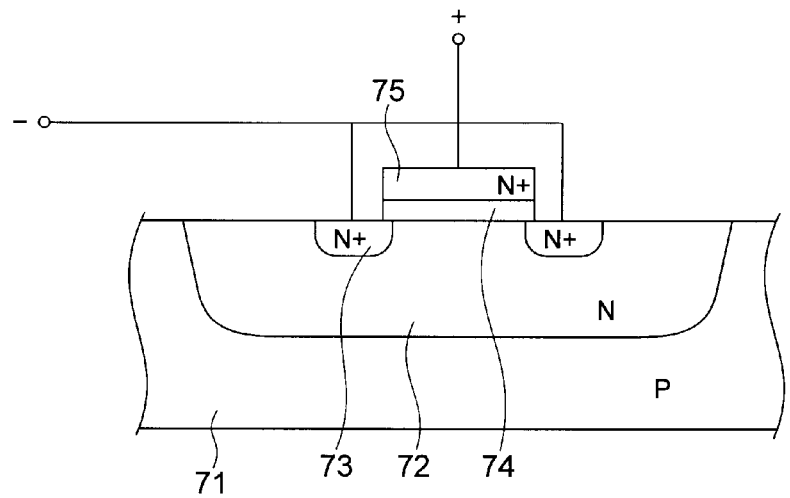
FIG. 7 is a view showing the schematic configuration of a semiconductor device according to a comparative example.

FIG. 7 is a view showing the schematic configuration of a semiconductor device according to another comparative example (second comparative example) for the first embodiment. An N well region 72 is provided at the surface of a P-type semiconductor substrate 71, and N+ diffusion layers 73 which serve as electrodes for applying a voltage are formed in the N well region 72.

A gate insulating film 74 is provided on the N well region 72, and a gate electrode 75 is provided on the gate insulating film 74. The gate insulating film 74 is made of a silicon oxide film. The gate electrode 75 is made of polysilicon doped with highly concentrated impurities of the same polarity (in this case, N-type) as that of the well region.

When a positive voltage is applied to the gate electrode 75, and a negative voltage is applied to the N+ diffusion layers 73, negative charges (electrons) are accumulated between the N+ diffusion layers 73, and an almost constant capacity can be achieved if the gate voltage is not less than 0 V. However, since the gate electrode 75 is doped with the N-type impurities, electrons floating in the gate electrode 75 are attracted to the positive charge side, and a depletion layer is generated at the surface on the gate insulating film 74 side of the gate electrode 75. Due to a capacitance in the depletion layer, the total capacity decreases.

Figure 8:
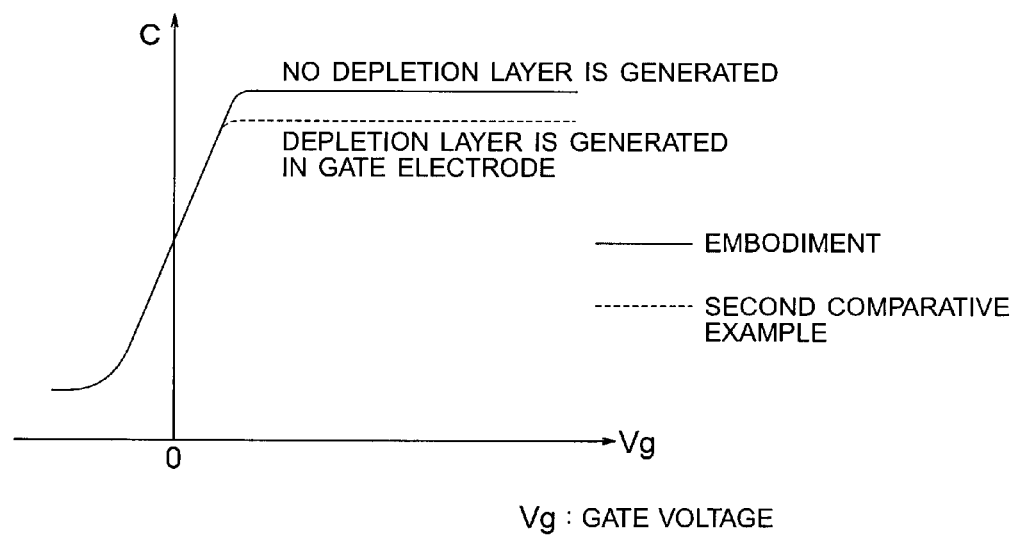
FIG. 8 is a graph showing the C-V characteristics of the semiconductor device according to the first embodiment of the present invention and that of the semiconductor device according to the comparative example.

FIG. 8 shows the C-V characteristics of the MOS-type capacitor as the semiconductor device according to the first embodiment and that of the MOS-type capacitor as the semiconductor device according to the second comparative example. The C-V characteristic for the first embodiment is indicated by a solid line while that for the second comparative example is indicated by a broken line. Since the MOS-type capacitor as the semiconductor device according to the first embodiment is different from that according to the second comparative example in that a depletion layer is not formed upon application of a voltage, the capacity can be made larger. The MOS-type capacitor as the semiconductor device according to the first embodiment is also different from the first comparative example in that an almost constant capacity can be achieved if the gate voltage is not less than 0 V.

When compared to an anti-fuse element in which a depletion layer is generated upon application of a voltage, an anti-fuse element with the same configuration as that of the semiconductor device according to the first embodiment in which no depletion layer is generated can be made lower in applied voltage required for an electrical breakdown.

As described above, according to the first embodiment, it is possible to suppress generation of a depletion layer at surface portions of a gate electrode and a well region and acquire a semiconductor device with a capacity corresponding to only the thickness of a gate insulating film. It is also possible to acquire an anti-fuse element which prevents an increase in voltage required for an electrical breakdown.

Second Embodiment

Figure 9:
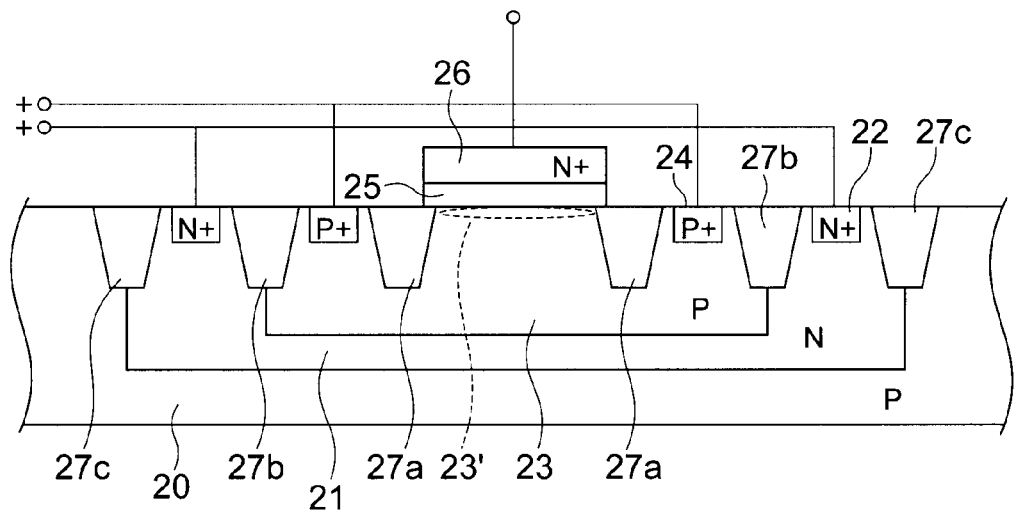
FIG. 9 is a view showing the schematic configuration of a semiconductor device according to a second embodiment of the present invention.

FIG. 9 schematically shows a vertical section of a semiconductor device according to a second embodiment of the present invention. A buried N well region 21 is provided in a P-type semiconductor substrate 20, and an N+ diffusion layer 22 serves as an electrode for applying a voltage to the buried N well region 21. A P well region 23 is provided on the buried N well region 21, and a P+ diffusion layer 24 serves as an electrode for applying a voltage to the P well region 23. The N+ diffusion layer 22 is formed between element isolating regions 27b and 27c, and the P+ diffusion layer 24 is formed between an element isolating region 27a and the element isolating region 27b.

A gate insulating film 25 is provided on the P well region 23, and a gate electrode 26 is provided on the gate insulating film 25. The gate electrode 26 is made of polysilicon doped with highly concentrated impurities of a polarity (in this case, N-type) opposite to that of the well region 23. The element isolating regions 27 (27a to 27c) are formed by STI (Shallow Trench Isolation).

Figure 10:
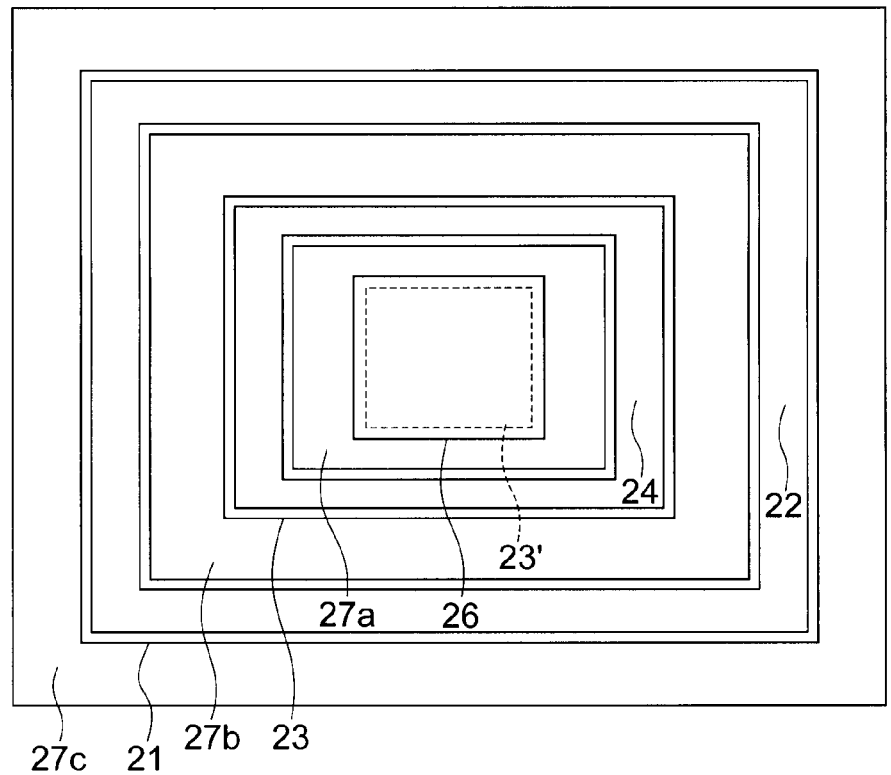
FIG. 10 is a view showing the schematic configuration of the semiconductor device according to the second embodiment.

FIG. 10 shows a view of the semiconductor device as seen from above. The element isolating region 27a is formed in the P well region 23 along the edges of the gate electrode 26. The element isolating region 27a prevents part of N-type impurities which has deviated from the gate electrode 26 from diffusing into the P+ diffusion layer 24 when the gate electrode 26 is doped with the N-type impurities.

A negative voltage is applied to the gate electrode 26 of the semiconductor device while a positive voltage is applied to the buried N well region 21 and P well region 23. A voltage equal to or higher than one applied to the P well region 23 is applied to the buried N well region 21.

Figure 11:
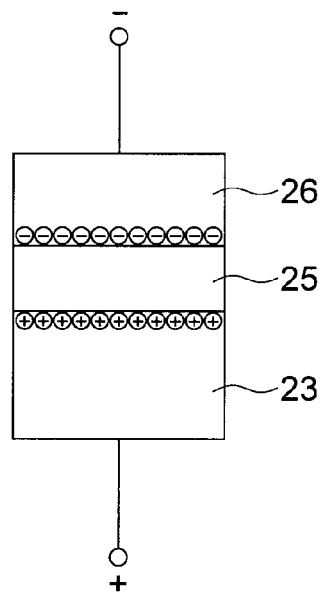
FIG. 11 is an enlarged schematic view of a portion near a gate insulating film of the semiconductor device according to the second embodiment.

FIG. 11 shows a schematic view representing the state of a portion near the gate insulating film at this time. With the above-described voltage relationship, positive charges (holes) are accumulated at a surface portion 23' on the gate insulating film 25 side of the P well region 23, and negative charges (electrons) are accumulated at a surface portion on the gate insulating film 25 side of the gate electrode 26.

The P well region 23 inherently has many holes while the gate electrode 26 inherently has many electrons. Accordingly, no depletion layer is formed in either the surface portion on the gate insulating film 25 side of the P well region 23 or that on the gate insulating film 25 side of the gate electrode 26, and the capacity of the semiconductor device becomes correspondent to only the thickness of the gate insulating film.

COMPARATIVE EXAMPLE

Figure 12:
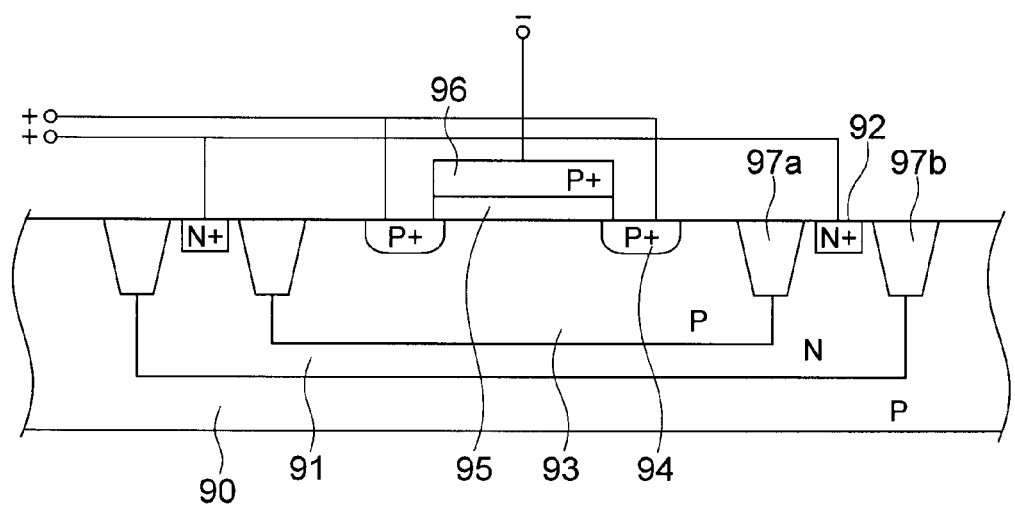
FIG. 12 is a view showing the schematic configuration of a semiconductor device according to a comparative example.

FIG. 12 shows the schematic configuration of a semiconductor device according to a comparative example for the second embodiment. A buried N well region 91 is provided in a P-type semiconductor substrate 90, and an $N^+$ diffusion layer 92 serves as an electrode for applying a voltage to the buried N well region 91. A P well region 93 is provided on the buried N well region 91, and $P^+$ diffusion layers 94 serve as electrodes for applying a voltage to the P well region 93. The $N^+$ diffusion layer 92 is formed between element isolating regions 97a and 97b.

A gate insulating film 95 is provided on the P well region 93, and a gate electrode 96 is provided on the gate insulating film 95. The gate insulating film 95 is made of a silicon oxide film. The gate electrode 96 is made of polysilicon doped with highly concentrated impurities of the same polarity (in this case, P-type) as that of the well region 93.

A negative voltage is applied to the gate electrode 96 of the semiconductor device, and a positive voltage is applied to the buried N well region 91 and P well region 93. A voltage equal to or higher than one applied to the P well region 93 is applied to the buried N well region 91. Upon application of these voltages, positive charges (holes) are accumulated between the $P^+$ diffusion layers 94, and an almost constant capacity can be achieved if the gate voltage is not more than 0 V.

However, since the gate electrode 96 is doped with the P-type impurities, holes floating in the gate electrode 96 are attracted to the negative charge side, and a depletion layer is generated at the surface on the gate insulating film 95 side of the gate electrode 96. Due to a capacitance in the depletion layer, the total capacity decreases.

Figure 13:
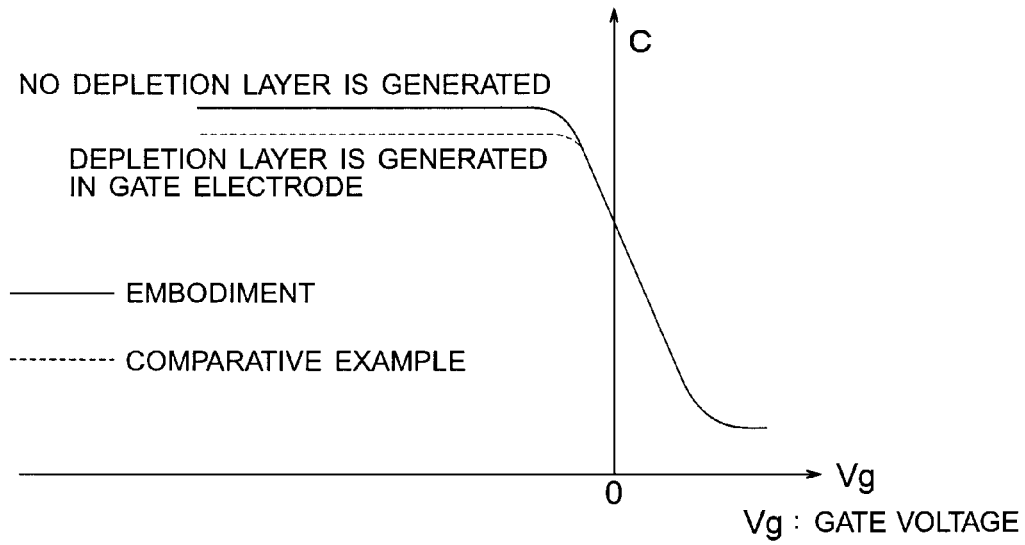
FIG. 13 is a graph showing the C-V characteristics of the semiconductor device according to the second embodiment of the present invention and that of the semiconductor device according to the comparative example.

FIG. 13 shows the C-V characteristics of a MOS-type capacitor as the semiconductor device according to the second embodiment and that of a MOS-type capacitor as the semiconductor device according to the comparative example. The C-V characteristic for the second embodiment is indicated by a solid line while that for the comparative example is indicated by a broken line. Since the MOS-type capacitor as the semiconductor device according to the second embodiment is different from that according to the comparative example in that a depletion layer is not formed upon application of a voltage, the capacity can be made larger.

When compared to an anti-fuse element in which a depletion layer is generated upon application of a voltage, an anti-fuse element with the same configuration as the semiconductor device according to the second embodiment in which no depletion layer is generated can be made lower in applied voltage required for an electrical breakdown.

As described above, according to the second embodiment, it is possible to suppress generation of a depletion layer at surface portions of a gate electrode and a well region and acquire a semiconductor device with a capacity corresponding to only the thickness of a gate insulating film. It is also possible to acquire an anti-fuse element which prevents an increase in voltage required for an electrical breakdown.

Third Embodiment

Figure 14:
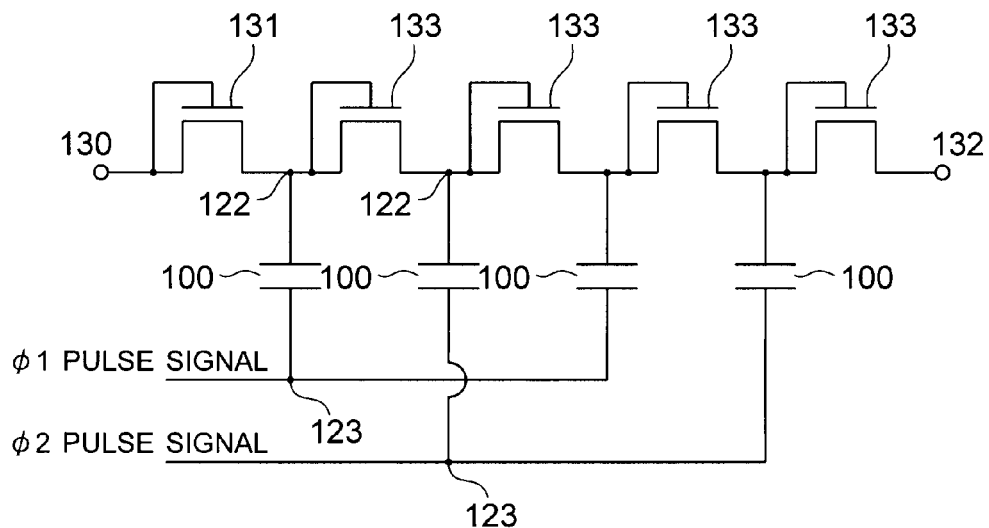
FIG. 14 is a diagram showing the schematic configuration of a charge pumping circuit according to a third embodiment of the present invention.

FIG. 14 shows the schematic configuration of a charge pumping circuit according to a third embodiment of the present invention. A power supply voltage is applied to an input terminal 130, and a boosted voltage is output from an output terminal 132. The input terminal 130 and a gate electrode of an input MOS transistor 131 are connected to a source region of the input MOS transistor 131. A plurality of boost MOS transistors 133 are series-connected between a drain region of the input MOS transistor 131 and the output terminal 132. Gate electrodes of the boost MOS transistors 133 are connected to respective source regions thereof. A plurality of capacitors 100 have terminals 122 which are respectively connected to the source regions of the boost MOS transistors 133.

Pulse signals φ1 and φ2 which are complementary to each other are input to terminals 123 of each adjacent two of the capacitors 100.

The capacitors 100 are MOS capacitors which have the same configuration as that of the semiconductor device according to the first embodiment shown in FIG. 1. Each terminal 122 is a terminal for applying a voltage to a gate electrode 14 while each terminal 123 is a terminal for applying a voltage to an $N^+$ diffusion layer 12.

When the power supply voltage is applied to the input terminal 130, and the complementary pulse signals φ1 and φ2 are input to the terminals 123, the charge pumping circuit performs voltage boosting operation and outputs a boosted voltage from the output terminal 132.

Since the capacitors 100 have the advantage of suppressing generation of a depletion layer over a conventional MOS capacitor, they do not decrease in capacity. Accordingly, the charge pumping circuit according to this embodiment has improved voltage boosting capability compared to a charge pumping circuit using a conventional MOS capacitor.

If the capacitors 100 are formed to have the same configuration as that of the semiconductor device according to the second embodiment shown in FIG. 9, each terminal 122 is a terminal for applying a voltage to an $N^+$ diffusion layer 22 and a $P^+$ diffusion layer 24 while each terminal 123 is a terminal for applying a voltage to a gate electrode 26.

Fourth Embodiment

Figure 15:
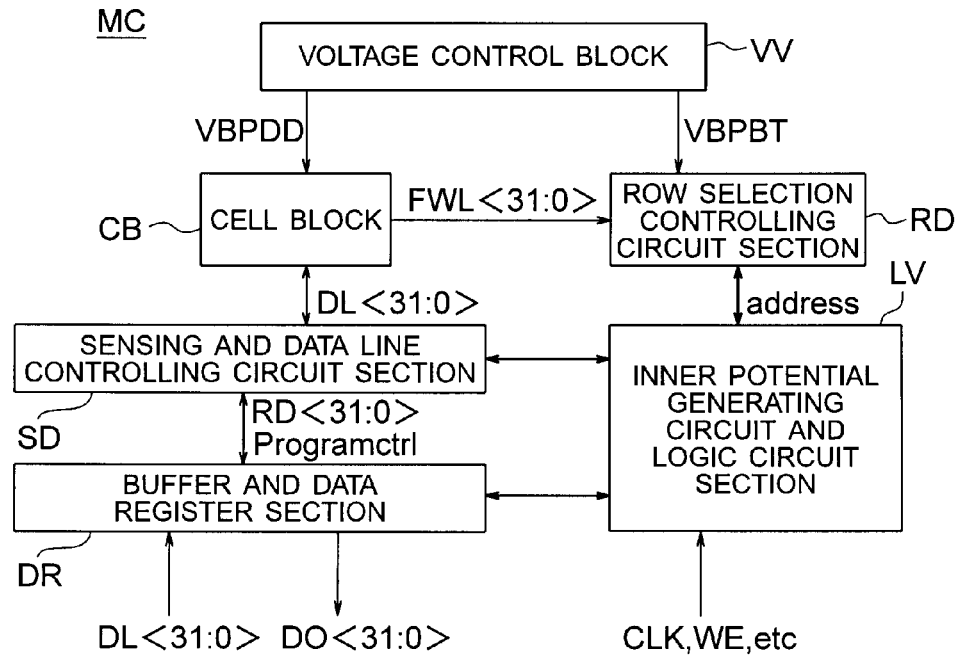
FIG. 15 is a diagram showing the schematic configuration of a memory circuit according to a fourth embodiment of the present invention.

FIG. 15 shows the schematic configuration of a memory circuit according to a fourth embodiment of the present invention. A memory circuit MC has a cell block CB, a row selection controlling circuit section RD, a sensing and data line controlling circuit section SD, a buffer and data register section DR, an inner potential generating circuit and logic circuit section LV, and a voltage controlling block VV which generates a high voltage and controls voltages applied to the sections of the memory circuit MC. A case will be described here where the cell block CB is composed of cells for 1,024 bits (32 by 32 bits).

Figure 16:
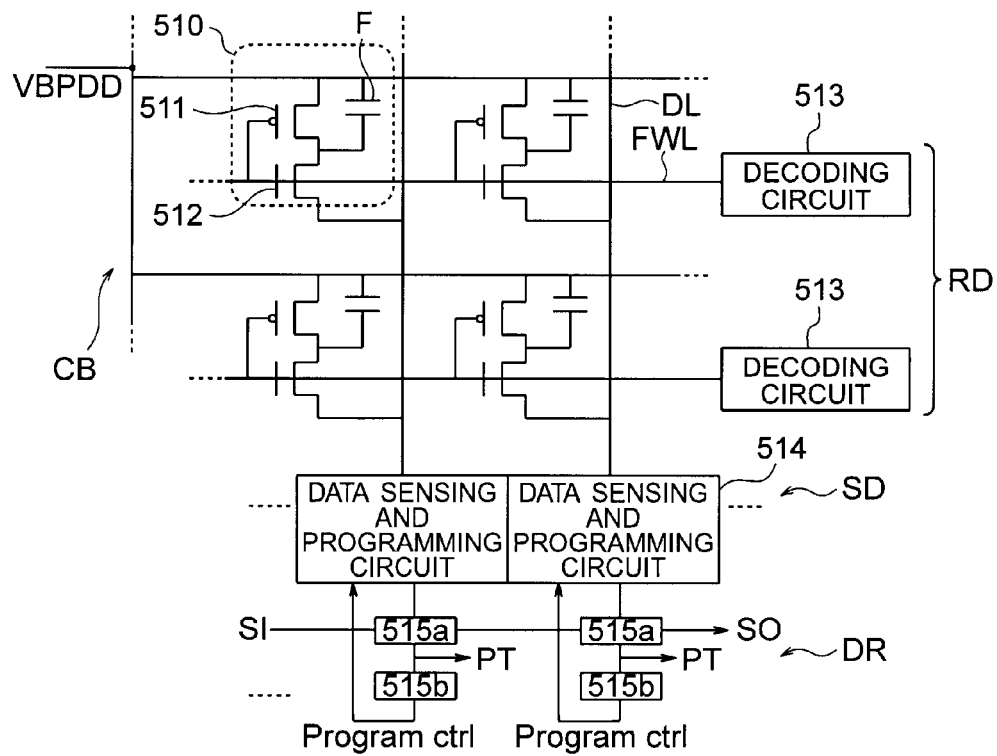
FIG. 16 is a diagram showing the schematic configuration of a main portion in the memory circuit according to the fourth embodiment.

In the cell block CB, 1,024 fuse cell sections 510 are arranged in a 32- by 32-bit matrix (array), as shown in FIG. 16. Note that four (corresponding to 2 by 2 bits) of the fuse cell sections 510 are shown in FIG. 16, for illustrative convenience. Each fuse cell section 510 has an anti-fuse element F which has two terminals, a p-type MOS transistor (protective transistor) 511 for relieving an electric field applied to the anti-fuse element F in an unprogrammed state, and an n-type MOS transistor 512 which is a selection transistor (selection switch) for controlling connection between the anti-fuse element F and protective transistor 511 and a data line DL.

The anti-fuse element F is a semiconductor element which has the same MOS structure as that of the semiconductor device according to the first embodiment shown in FIG. 1. Fuse data is stored in the semiconductor element by applying a high voltage above the maximum rating to the semiconductor element and physically breaking down a gate insulating film 13. For example, fuse data "0" is stored in ones of the anti-fuse elements whose insulating films have not been broken down while fuse data "1" is stored in the others, whose insulating films have been broken down. Accordingly, the memory circuit MC according to this embodiment functions as an OTP (One-Time Programmable) memory to which data can be written only once.

A potential "VBPDD" from the voltage controlling block VV is applied to one of the terminals which is on the gate electrode side (corresponding to a terminal shown in FIG. 1 through which a voltage is applied to the gate electrode 14) of each anti-fuse element F and one of source and drain terminals of the corresponding protective transistor 511. The other terminal (corresponding to a terminal shown in FIG. 1 through which a voltage is applied to the $N^+$ diffusion layer 12) of the anti-fuse element F is connected to a junction of the other of the source and drain terminals of the protective transistor 511 and one of source and drain terminals of the corresponding n-type MOS transistor 512.

Gate terminals of the protective transistor 511 and the n-type MOS transistor 512 are connected to a corresponding one of 32 fuse word lines (row selection lines) FWL (FWL<31:0>). The other of the source and drain terminals of the n-type MOS transistor 512 is connected to a corresponding one of the 32 data lines DL (DL<31:0>).

Of the fuse-cell sections 510 for 1,024 bits arranged in the matrix, each set of fuse-cell sections 510 for 32 bits arranged row-wise is connected to the corresponding common fuse word line FWL. The fuse word lines FWL are driven by respective decoding circuits 513 which constitute the row selection controlling circuit section RD.

Accordingly, driving of a corresponding one of the fuse word lines FWL by one of the decoding circuit 513 causes the fuse cell sections 510 for 32 bits connected to the fuse word line FWL to be simultaneously selected.

Similarly, each set of fuse-cell sections 510 for 32 bits arranged column-wise is connected to the corresponding common data line DL. The data lines DL, to each of which the corresponding fuse-cell sections 510 for 32 bits arranged column-wise are commonly connected, are controlled by respective data sensing and programming circuits 514 which constitute the sensing and data line controlling circuit section SD.

Accordingly, it is possible to select a desired one of the fuse cell sections 510 for 32 bits arranged row-wise by controlling a corresponding one of the data lines DL by one of the data sensing and programming circuits 514.

The row selection controlling circuit section RD is composed of the 32 decoding circuits 513. A potential "VBPBT" is supplied to the row selection controlling circuit section RD by the voltage controlling block VV, as shown in FIG. 15.

The sensing and data line controlling circuit section SD has the 32 data sensing and programming circuits 514, each of which is provided for each of the data lines DL. Each data sensing and programming circuit 514 drives the corresponding data line DL and is configured to have a sense amplifier (not shown) and the like which senses data (e.g., a current value) read out from each of the corresponding fuse cell sections 510 onto the data line DL by comparing the data with a reference value or the like.

The inner potential generating circuit and logic circuit section LV receives various control signals (e.g., CLK and WE) from the side of a controller (not shown) and generates a new control signal (e.g., address) or an inner potential used to control the sense amplifiers and the like.

The voltage controlling block VV is composed of a power supply circuit which generates and supplies the potentials "VBPDD" and "VBPBT." For example, the potential "VBPDD" is controlled by the voltage controlling block VV such that it is set at a potential "VBP" (a voltage above the maximum rating of the anti-fuse elements F) during program operation, is set at a power supply voltage "VDD" during data reading, and is set at 0 V during standby.

The potential "VBPBT" is controlled such that it is set at the potential "VBP" (the voltage above the maximum rating of the anti-fuse elements F) during program operation, is set at a power supply voltage "VBT" during data reading (the potential of the fuse word lines FWL (midpoint potential) during data reading), and is set at 0 V during standby.

The buffer and data register section DR is intended to manage data to be exchanged with the outside (input data DI<31:0> and output data DO<31:0>) and has 32 buffers and data registers 515. Each buffer and data register 515 is configured to have a data controlling circuit 515*a* and a data holding circuit 515*b* which are provided for each of the data lines DL, as shown in FIG. 16. The data controlling circuit 515*a* as a write controlling circuit supplies a program controlling signal Program ctrl to the corresponding data sensing and programming circuit 514 through the data holding circuit 515*b*.

A parallel input/output terminal PT is connected to each buffer and data register 515, and it can simultaneously output fuse data for 32 bits. A serial input terminal SI is connected to the buffer and data register 515 at one end, and a serial output terminal SO is connected to the buffer and data register 515 at the other end.

The operation of the memory circuit MC will be described. For example, to read out data stored in a specific one of the fuse cell sections 510, the decoding circuit 513 first selects the fuse word line FWL, to which the fuse cell section 510 is connected. With this operation, the data stored in the fuse cell section 510 connected to the selected fuse word line FWL is read out through the corresponding data line DL.

The read-out data is amplified and held by the corresponding data sensing and programming circuit 514. The amplified data (RD<31:0>) is held by the corresponding data register 515 and then output through the corresponding parallel input/output terminal PT.

On the other hand, to write data to a specific one of the fuse cell sections 510, data for selecting the data line DL, to which the fuse cell section 510 to be written to is connected, is first taken into the corresponding buffer and data register 515 through the corresponding parallel input/output terminal PT or the serial input terminal SI.

The data and selection of the fuse word line FWL, to which the fuse cell section 510 is connected, by the corresponding decoding circuit 513 allow writing to the anti-fuse element F. At the time of data writing, the voltage "VBP" above the maximum rating is applied to the gate insulating film of the anti-fuse element F of the fuse cell section 510, and the gate insulating film is broken down, thereby programming fuse data.

In the above-described manner, writing of data to and reading of data from the fuse cell sections 510 are performed.

When compared to a conventional anti-fuse element in which a depletion layer is generated upon application of a voltage, the anti-fuse elements F, in which no depletion layer is generated, can be made lower in applied voltage required for an electrical breakdown ("VBP"). Accordingly, the memory circuit according to this embodiment can be made lower in writing voltage than a memory circuit using a conventional anti-fuse element.

If each anti-fuse F is formed to have the same configuration as that of the semiconductor device according to the second embodiment shown in FIG. 9, the potential "VBPDD" from the voltage controlling block VV is applied to a terminal through which a voltage is applied to an $N^+$ diffusion layer 22 and one through which a voltage is applied to a $P^+$ diffusion layer 24, and a terminal through which a voltage is applied to a gate electrode 26 is connected between the other of the source and drain terminals of the protective transistor 511 and the one of the source and drain terminals of the n-type MOS transistor 512.

Although a P-type semiconductor substrate is used as a semiconductor substrate in each of the above-described embodiments, an N-type semiconductor substrate may be used instead. In this case, the polarity (P-type or N-type) of impurities with which each of a well region or regions and a gate electrode is doped and the polarities of voltages to be applied are reversed.

A material with a high relative dielectric constant may be used for a gate insulating film. Although each element isolating region is formed by STI, it may be formed to have a LOCOS (Local Oxidation of Silicon) structure.

What is claimed is:

1. A semiconductor device comprising:
   a first well region which is formed at a surface portion of a semiconductor substrate;
   a first element isolating region which is formed along an edge of the first well region;
   a gate insulating film which is formed on the first well region;
   a second element isolating region which is formed at a surface portion of the first well region and below an edge of the gate insulating film, an entirety of the second element isolating region being located inside the first well region;
   a first diffusion layer which is formed at a surface portion of the first well region between the first element isolating region and the second element isolating region and to which a first voltage is applied; and
   a gate electrode which is formed on the gate insulating film and has a polarity different from a polarity of the first well region and the first diffusion layer, and to which a second voltage is applied,
   wherein a capacitance is formed between the region within the first well region surrounded by the second element isolating region and the gate electrode.

2. The semiconductor device according to claim 1, wherein the first well region is of n-type, the gate electrode is of p-type, the first diffusion layer is an $N^+$ diffusion layer, and the second voltage is higher than the first voltage.

3. The semiconductor device according to claim 1, wherein edges of the gate electrode are located directly above the second element isolating region.

4. The semiconductor device according to claim 1, wherein the semiconductor device functions as an anti-fuse after the gate insulating film is broken down by the voltages applied to the gate electrode and the first diffusion layer.

5. The semiconductor device according to claim 1, further comprising:
   a second well region at a surface portion of the semiconductor substrate in which the first well region is formed at a surface portion, which has a polarity different from the polarity of the first well region;
   a third element isolating region which is formed along an edge of the second well region; and
   a second diffusion layer which is formed at a surface portion of the second well region between the first element isolating region and the third element isolating region and to which a third voltage is applied.

6. The semiconductor device according to claim 5, wherein the gate electrode and the second well region are of n-type, the first well region is of p-type, the first diffusion layer is a $P^+$ diffusion layer, the second diffusion layer is an $N^+$ diffusion layer, the third voltage is not less than the first voltage, and the second voltage is lower than the first voltage.

7. The semiconductor device according to claim 5, wherein edges of the gate electrode are located directly above the second element isolating region.

8. The semiconductor device according to claim 5, wherein the semiconductor device functions as an anti-fuse after the gate insulating film is broken down by the voltages applied to the gate electrode and the first diffusion layer.

* * * * *